United States Patent [19]
Chen et al.

[11] Patent Number: 6,031,776
[45] Date of Patent: Feb. 29, 2000

[54] SENSE AMPLIFIER CIRCUIT FOR A SEMICONDUCTOR MEMORY DEVICE

[75] Inventors: Juei-Lung Chen; Hsin-Pang Lu, both of Hsinchu, Taiwan

[73] Assignee: United Microelectronics Corp., Hsinchu, Taiwan

[21] Appl. No.: 09/376,750

[22] Filed: Aug. 17, 1999

[51] Int. Cl.[7] ................................................. G11C 7/00
[52] U.S. Cl. ........................ 365/205; 365/207; 365/208
[58] Field of Search .................................... 365/205, 207, 365/208

[56] References Cited

U.S. PATENT DOCUMENTS 5,546,338  8/1996  Proebsting ............................. 365/207
5,986,944  11/1999  Merritt .................................... 365/207

Primary Examiner—Trong Phan
Attorney, Agent, or Firm—Hickman Stephens Coleman & Hughes, LLP

[57] ABSTRACT

A sense amplifier circuit for a semiconductor memory device. The sense amplifier of this invention has four more NMOS transistors than a conventional amplifier. The gate terminals of two of the NMOS transistors are connected to a write enable line. The gate terminals of the other two NMOS transistors are connected to a first and a second node point, which are in turn connected to a bit line and a complementary bit line, respectively. Through a feedback circuit provided by these four additional NMOS transistors, two of the NMOS transistors are switched on during a write cycle to provide a ground connection so that voltage level of the sense amplifier is rapidly pulled down. Since the latching speed of the sense amplifier is increased, the operating speed of the memory is increased, as well. In addition, partial writing of data can be avoided.

8 Claims, 3 Drawing Sheets

SENSE AMPLIFIER CIRCUIT FOR A SEMICONDUCTOR MEMORY DEVICE

BACKGROUND OF THE INVENTION

1. Field of Invention

The present invention relates to a sense amplifier. More particularly, the present invention relates to a sense amplifier circuit capable of accelerating the latching speed of the sense amplifier, thereby increasing the operating speed of a semiconductor memory device.

2. Description of Related Art

Data within a particular memory unit of a semiconductor memory such as dynamic random access memory (DRAM) are generally amplified and read out by a sense amplifier. The sense amplifier is connected to a bit line of a memory cell array so that any particular cell can be addressed.

FIG. 1 is a circuit diagram of a conventional sense amplifier. The sense amplifier 10 consists of a pair of NMOS transistors 12, 14 and a pair of PMOS transistors 16, 18. Interconnections of the transistors are shown in FIG. 1. The sense amplifier 10 is connected to bit lines BL and BLB of a memory cell array (not shown in the figure) for reading and amplifying the data from a selected memory cell. The bit line BLB is a complementary bit line. The sense amplifier 10 is also connected to data lines DL and DLB via NMOS transistors 20 and 22, respectively. The data line DLB is also a complementary data line. On/off states of the NMOS transistors 20 and 22 are determined by the voltage of a column address line COL. In FIG. 1, labels NSA and PSA are points for inputting complementary sense amplifier enable signals.

In the prior art, when the sense amplifier 10 is writing data into the memory, the complementary data line DLB must be kept at a low voltage level in order to latch the amplifier 10. As the operating voltage drops during the writing cycle, the complementary data line DLB reaches the low potential level demanded by the sense amplifier 10 only slowly due to the presence of a pass gate. A consequence is that data may only be partially written into the memory.

SUMMARY OF THE INVENTION

Accordingly, one object of the present invention is to provide a sense amplifier circuit having a higher latching speed so that memory data can be accessed faster.

To achieve these and other advantages and in accordance with the purpose of the invention, as embodied and broadly described herein, the invention provides a sense amplifier circuit for a semiconductor memory device. The sense amplifier of this invention has four more NMOS transistors than a conventional amplifier. The gate terminals of two of the NMOS transistors are connected to a write enable line. The gate terminals of the other two NMOS transistors are connected to a first and a second node point, which are in turn connected to a bit line and a complementary bit line, respectively. Through a feedback circuit provided by these four additional NMOS transistors, two of the NMOS transistors are switched on during a write cycle to provide a ground connection so that voltage level of the sense amplifier is rapidly pulled down. Hence, latching speed of the sense amplifier is increased.

Since the sense amplifier circuit of this invention is capable of having its voltage level rapidly pulled down during a write cycle, latching speed of the sense amplifier is increased. Hence, the operating speed of memory is increased and partial writing of data is avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
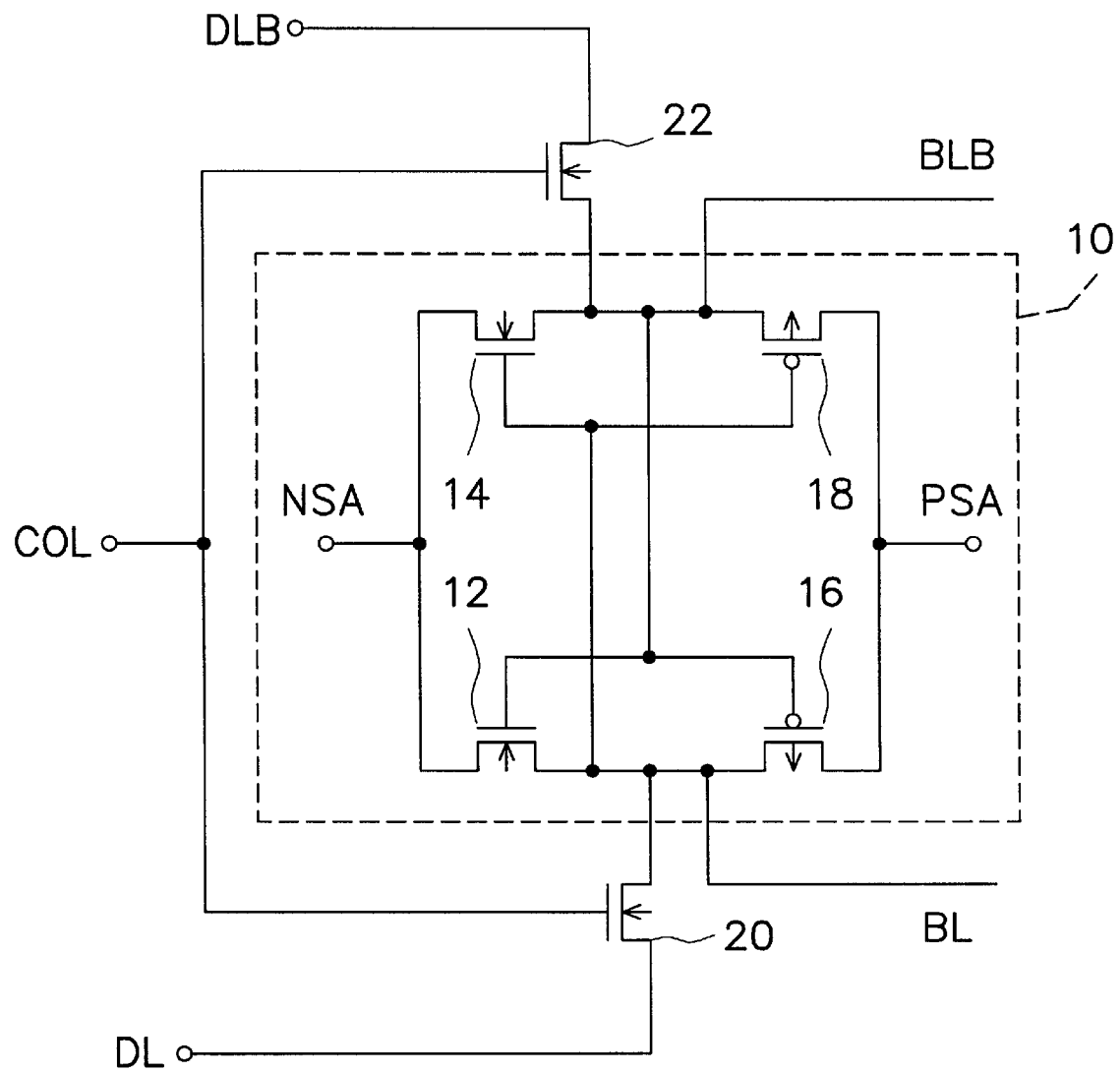
FIG. 1 is a circuit diagram of a conventional sense amplifier.

Reference will now be made in detail to the present preferred embodiments of the invention, examples of which are illustrated in the accompanying drawings. Wherever possible, the same reference numbers are used in the drawings and the description to refer to the same or like parts.

Figure 2:
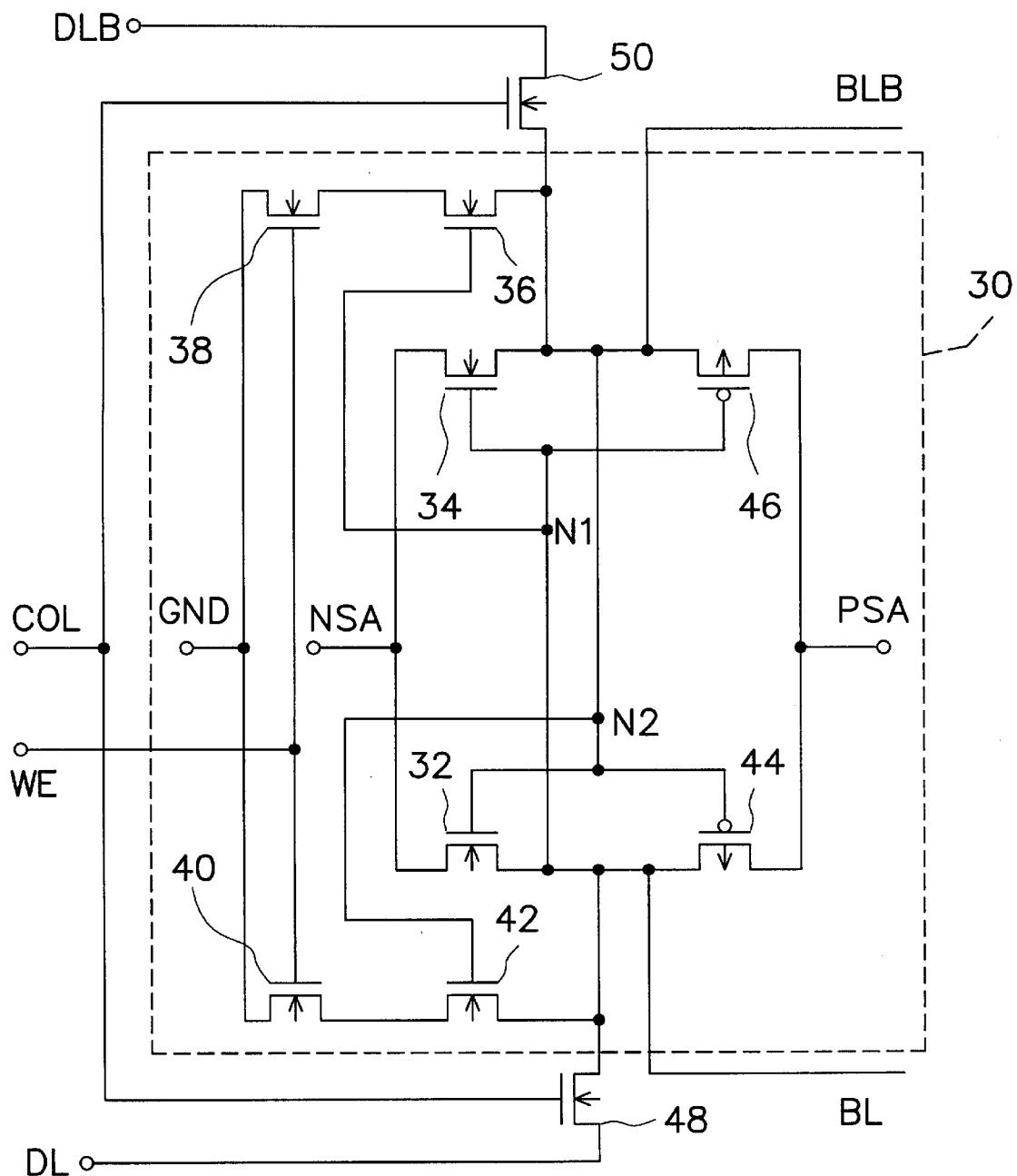
FIG. 2 is a circuit diagram of a sense amplifier according to one preferred embodiment of this invention.

FIG. 2 is a circuit diagram of a sense amplifier according to one preferred embodiment of this invention. As shown in FIG. 2, the sense amplifier 30 comprises six NMOS transistors 32, 34, 36, 38, 40 and 42 and a pair of PMOS transistors 44 and 46. The sense amplifier 30 is connected to bit lines BL and BLB of a memory cell array (not shown in the figure) for reading and amplifying the data from a selected memory cell. In addition, the sense amplifier 30 is connected to data lines DL and DLB via NMOS transistors 48 and 50, respectively. On/off states of the NMOS transistors 48 and 50 are determined by the voltage potential of a column address line COL. Labels NSA and PSA are points for inputting complementary sense amplifier enable signals. For example, NSA is connected to a low potential such as a ground and PSA is connected to a high potential such as a voltage signal. GND is a connection to the ground while WE is a write enable line for determining the on/off states of the NMOS transistors 38 and 40.

Figure 3:
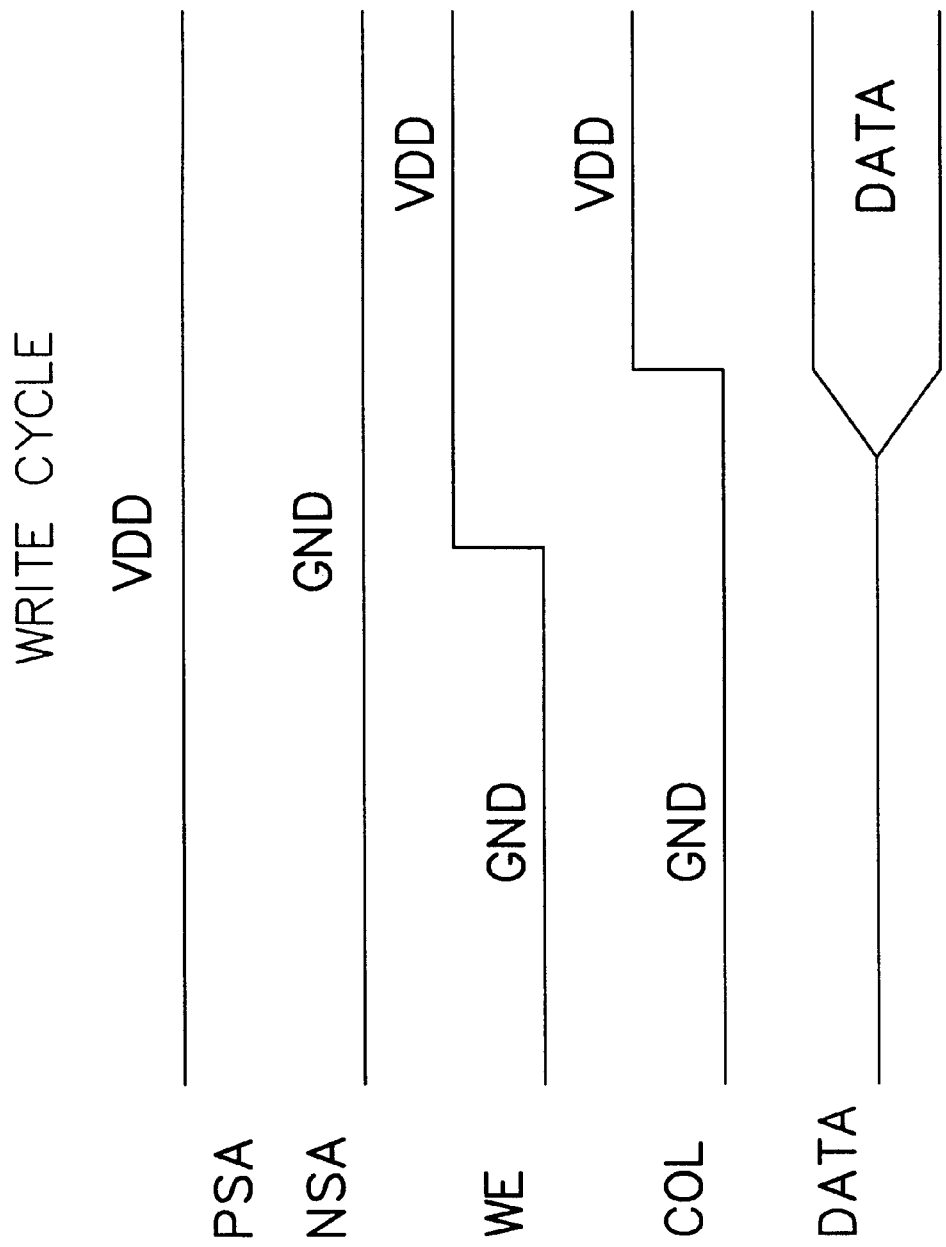
FIG. 3 is a timing diagram showing the signal waveforms of various lines going to the sense amplifier during a write cycle.

FIG. 3 is a timing diagram showing the signal waveforms of various lines going to the sense amplifier 30 during a write cycle. According to the circuit layout of the sense amplifier 30 as shown in FIG. 2, the write enable line WE is high during a write cycle. The NMOS transistors 38 and 40 are both turned on. Furthermore, the column address line COL also rises to a high level so that data may be written into the sense amplifier 30 via the data line DL and the complementary data line DLB.

For example, data is written into node N1 and N2 of the sense amplifier 30 by setting the data line DL to a logic level '1' and the complementary data line DLB to a logic level '0'. Aside from a discharge from node point N2 due to the logic potential of '0' on the complementary data line DLB, NMOS transistor 36 also becomes conductive due to a logic level of '1' at node point N1. Consequently, the rate of fall of potential at node point N2 is accelerated. Because node point N2 is at a low potential, NMOS transistor 42 is in a non-conductive state. Thus, a voltage level of '1' is maintained in node point N1. The voltage at node point N1 is identical to the voltage at bit line BL while the voltage at node point N2 is identical to the voltage at the complementary bit line BLB as shown in FIG. 2.

In other words, four additional NMOS transistors 36, 38, 40 and 42 are added on top of the transistors in a conventional sense amplifier such as 10 in FIG. 1. The gate terminals of the NMOS transistors 38 and 40 are connected to the write enable line WE. In a write cycle, the NMOS transistors 38 and 40 are connected to ground GND so that potential level of the sense amplifier 30 is rapidly pulled down and the latching speed of the sense amplifier 30 is increased. Hence, operating speed of memory is also increased.

Because the NMOS transistors 36, 38, 40 and 42 of this invention are able to provide a feedback loop, potential level of the sense amplifier 30 is rapidly pulled down through NMOS transistors 38 and 40 during a write cycle. Therefore, latching speed of the sense amplifier 30 is greatly increased.

In summary, the advantage of this invention includes the rapid pull-down of potential level during a write cycle. Thus, latching speed of the sense amplifier is increased leading to a higher operating speed for the memory so that partial writing of data can be avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A sense amplifier circuit for a semiconductor memory device, comprising:

a first NMOS transistor having a source terminal is connected to a complementary data line and a gate terminal connected to a first node point;

a second NMOS transistor having a drain terminal connected to the drain terminal of the first NMOS transistor, a gate terminal connected to a write enable line and a source terminal connected to a ground;

a third NMOS transistor having a source terminal connected to a ground and a gate terminal connected to the write enable line;

a fourth NMOS transistor having a drain terminal connected to the drain terminal of the third NMOS transistor, a gate terminal connected to a second node point and a source terminal connected to a data line;

a fifth NMOS transistor having a drain terminal connected to a first sense amplifier enable line, a gate terminal connected to the second node point and a source terminal connected to the data line and the first node point;

a sixth NMOS transistor having a drain terminal connected to the first sense amplifier enable line, a gate terminal connected to the first node point and a source terminal connected to a complementary data line and the second node point;

a first PMOS transistor having a drain terminal connected to a second sense amplifier enable line, a gate terminal connected to the second node point and a source terminal connected to the data line and the first node point; and a second PMOS transistor having a drain terminal connected to the second sense amplifier enable line, a gate terminal connected to the first node point, and a source terminal connected to the complementary data line and the second node point.

2. The sense amplifier of claim 1, wherein the circuit further includes a seventh NMOS transistor positioned between the sense amplifier circuit and the data line such that a drain terminal of the seventh NMOS transistor is connected to the first node point, a gate terminal of the seventh NMOS transistor is connected to a column address line and a source terminal of the seventh NMOS transistor is connected to the data line.

3. The sense amplifier circuit of claim 1, wherein the circuit further includes an eighth NMOS transistor positioned between the sense amplifier circuit and the complementary data line such that a drain terminal of the eighth NMOS transistor is connected to the second node point, a gate terminal of the eighth NMOS transistor is connected to the column address line and a source terminal of the eighth NMOS transistor is connected to the complementary data line.

4. The sense amplifier circuit of claim 1, wherein the semiconductor memory device includes a dynamic random access memory.

5. The sense amplifier circuit of claim 1, wherein the first sense amplifier enable line includes a low potential ground signal.

6. The sense amplifier circuit of claim 1, wherein the second sense amplifier enable line includes a high potential voltage signal.

7. The sense amplifier circuit of claim 1, wherein the first node point has a voltage identical to a voltage of a bit line.

8. The sense amplifier circuit of claim 1, wherein the second node point has a voltage identical to a voltage of a complementary bit line.

* * * * *